United States Patent
Witte

(10) Patent No.: US 11,983,470 B2
(45) Date of Patent: May 14, 2024

(54) METHOD FOR SYNCHRONIZING PROGRAMS FOR SIMULATION OF A TECHNICAL SYSTEM

(71) Applicant: SIEMENS INDUSTRY SOFTWARE NV, Leuven (BE)

(72) Inventor: Martin Witte, Schwabach (DE)

(73) Assignee: Siemens Industry Software NV, Leuven (BE)

( * ) Notice: Subject to any disclaimer, the term of this patent is extended or adjusted under 35 U.S.C. 154(b) by 786 days.

(21) Appl. No.: 17/055,223

(22) PCT Filed: May 15, 2018

(86) PCT No.: PCT/EP2018/062482
§ 371 (c)(1),
(2) Date: Nov. 13, 2020

(87) PCT Pub. No.: WO2019/219170
PCT Pub. Date: Nov. 21, 2019

(65) Prior Publication Data
US 2021/0224437 A1 Jul. 22, 2021

(51) Int. Cl.
*G06F 30/20* (2020.01)
(52) U.S. Cl.
CPC .................... *G06F 30/20* (2020.01)
(58) Field of Classification Search
CPC ........................................ G06F 30/20
See application file for complete search history.

(56) References Cited

U.S. PATENT DOCUMENTS

2014/0330542 A1* 11/2014 Subramanian .......... G06F 30/20
703/1
2016/0055278 A1* 2/2016 Zehetner ................. G06F 17/10
703/2

OTHER PUBLICATIONS

Sadjina S, Kyllingstad LT, Skjong S, Pedersen E. Energy conservation and power bonds in co-simulations: non-iterative adaptive step size control and error estimation. Engineering with Computers. Jul. 2017;33:607-20. (Year: 2017).*

(Continued)

*Primary Examiner* — Chuen-Meei Gan
(74) *Attorney, Agent, or Firm* — Lempia Summerfield Katz LLC

(57) ABSTRACT

Systems and methods for synchronizing programs for simulation of a technical system. The programs including a first simulation program and a second simulation program. The first simulation program simulates the kinematics of the technical system and the second simulation program simulates a control of the operation of the technical system. The first simulation program outputs values of a first variable at first-time points between first-time intervals according to a first frequency in virtual simulated time and the second simulation program outputs values of a second variable at second time points between second time intervals according to a second frequency in virtual simulated time, the first frequency being lower than the second frequency. Values of the first variable at second time points between two successive first-time points are determined based on an approximation, where the second simulation program uses the approximated values in order to determine values of the second variable at second time points between the two successive first-time points. An error is determined based on the absolute value of the difference between a first integral value as seen from the first simulation program and a second integral value as seen from the second simulation program.

(Continued)

A warning is output by a user interface in case that the error exceeds a predetermined threshold.

20 Claims, 2 Drawing Sheets

(56) References Cited

OTHER PUBLICATIONS

Benedikt, M., Watzenig, D., Zehetner, J. and Hofer, A., 2013. NEPCE—A nearly energy-preserving coupling element for weak-coupled problems and co-simulations. In Coupled V: proceedings of the V International Conference on Computational Methods for Coupled Problems in Science and Engineering: 2013 (Year: 2013).*
Herfs W, Flender J, Storms S, Witte M. Data-Consistent Toolchain for a Requirements-Based Specification with the Interdisciplinary Modeling Language (IML). In2018 IEEE 22nd International Conference on Intelligent Engineering Systems (INES) Jun. 21, 2018 (pp. 000219-000224). IEEE. (Year: 2018).*
Anjorin A, Yigitbas E, Leblebici E, Schurr A, Lauder M, Witte M. Description languages for consistency management scenarios based on examples from the industry automation domain. arXiv preprint arXiv:1803.10831. Mar. 28, 2018. (Year: 2018).*
Benedikt, Martin, et al. "A nearly energy-preserving coupling element for holistic weak-coupled system co-simulations." NAFEMS World Congress. 2013. pp. 1-18.
Benedikt, Martin, et al. "Modern coupling strategies—is co-simulation controllable?." NAFEMS Seminar" Die Rolle von CAE in der Systemsimulation". . . , 2011. pp. 1-10.
International Preliminary Report on Patentability for International Patent Application PCT/EP2018!062482 dated Jul. 31, 2020.
PCT International Search Report and Written Opinion of International Searching Authority dated Jan. 29, 2019 corresponding to PCT International Application No. PCT/EP2018/062482.
Sadjina, Severin, et al. "Energy conservation and power bonds in co-simulations: non-iterative adaptive step size control and error estimation." Engineering with Computers 33.3 (2017): 607-620.

\* cited by examiner

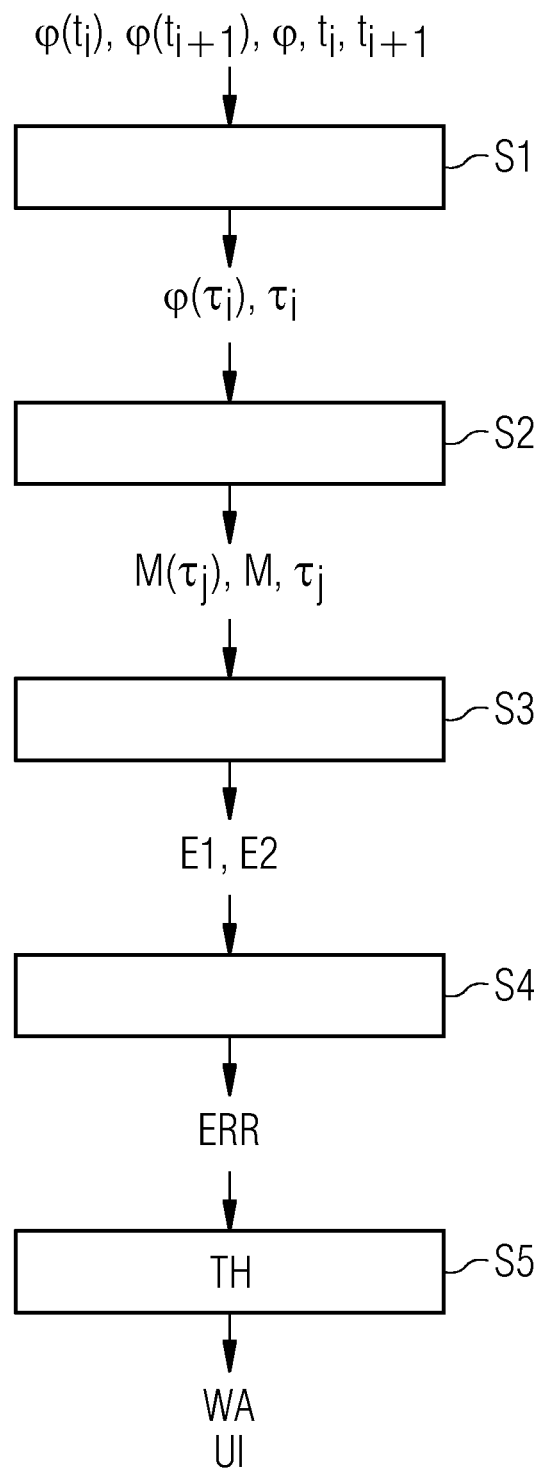

METHOD FOR SYNCHRONIZING PROGRAMS FOR SIMULATION OF A TECHNICAL SYSTEM

CROSS REFERENCE TO RELATED APPLICATIONS

This present patent document is a § 371 nationalization of PCT Application Serial Number PCT/EP2018/062482 filed May 15, 2018 designating the United States, which is hereby incorporated in its entirety by reference.

FIELD

Embodiments relate to a method for synchronizing programs for simulation of a technical system.

BACKGROUND

When simulating the operation of a technical system, there is often a need to combine several simulation programs. In order to provide a correct simulation result, the simulation programs use the same processing frequency. However, different time resolutions may be necessary for different simulation programs. The reason may be that some parts of the simulated system changes physically slow and needs much calculation time, while other parts change fast in time and do not need much computing power.

There are approaches in the prior art to enable multi-scale simulations of different time scales based on control message communication between the simulation programs as disclosed in M. BENEDIKT ET AL: "A nearly energy-preserving coupling element for holistic weak-coupled system co-simulations", NAFEMS WORLD CONGRESS, 1 Jan. 2013 (2013-01-01), XP055467717. However, no correct physical coupling between the simulation program boundaries is possible.

BRIEF SUMMARY AND DESCRIPTION

The scope of the present invention is defined solely by the appended claims and is not affected to any degree by the statements within this summary. The present embodiments may obviate one or more of the drawbacks or limitations in the related art.

Embodiments provide a method for synchronizing programs for simulation of a technical system enabling different time scales for the simulation programs and providing a monitoring of a simulation error.

The method synchronizes programs for simulation of a technical system. In an embodiment, the technical system is an automation system, e.g. a production system or a logistic system. Furthermore, the technical system may also refer to at least one automatically operating machine of an automation system.

The programs synchronized by the method include a first simulation program and a second simulation program, where the first simulation program outputs values of a first variable at first-time points between first-time intervals according to a first frequency in virtual simulated time and the second simulation program outputs values of a second variable at second time points between second time intervals according to a second frequency in virtual simulated time. The first frequency is lower than the second frequency, i.e. the first-time interval is longer than the second time interval. The values of the first variable are processed by the second simulation program in order to determine the values of the second variable and the values of the second variable valid at the first-time points are processed by the first simulation program in order to determine values of the first variable.

In the method, values of the first variable at second time points between two successive first-time points are determined based on an approximation, where the second simulation program uses the approximated values in order to determine values of the second variable at second time points between the two successive first-time points.

Furthermore, for respective first-time intervals, the integral of the second variable along the path of the first variable within the respective first-time interval is approximated based on a first integral value and a second integral value. The first integral value is determined based on the values of the first variable at first-time points limiting the respective first-time interval and an estimated value of the second variable for the respective first-time interval. The second integral value is determined based on the approximated values of the first variable at second time points limiting respective second time intervals lying within the respective first-time interval and an estimated value of the second variable for each second time interval lying within the respective first-time interval. In other words, the first integral value refers to an approximation of the integral as seen from the first simulation program and the second integral value refers to an approximation of the integral as seen from the second simulation program.

In an embodiment, the determination of the second integral value may also take into account at least one second or two second time intervals (if any) partially overlapping with the respective first-time interval. In other words, the determination of the second integral value may also include values of second time intervals overlapping the boundary of the respective first-time interval.

After having calculated the first and second integral values, an error is determined based on the absolute value of the difference between the first integral value and the second integral value. In case that this error exceeds a predetermined threshold, a warning is output by a user interface (e.g. a display) and/or the first frequency of the slower first simulation program is increased.

The method includes the advantage that a correct coupling of two simulation programs is achieved by approximating the variables of the slower simulation for use in the faster simulation. Furthermore, an appropriate error reflecting the interaction of the simulation programs is provided. This is achieved by a combination of the first and second variables to common quantities in the form of integral values that may relate between simulators. In embodiments, the first and second variables are such that the first and second integral values reflect physical work or electric energy or enthalpy. The first and the second variables may refer to an (effect, flow) tuple where the variable output by one simulation program is used by the other simulation program and vice versa.

In an embodiment, the first integral value includes and preferably is the product of the estimated value of the second variable for the respective first-time interval and the difference between the values of the first variable at the first-time points limiting the respective first-time interval.

In an embodiment, the estimated value of the second variable for the respective first-time interval corresponds to the value of the second variable valid at the first-time point at which the respective first-time interval starts. However, the estimated value may also be determined differently, e.g. based on an arithmetic mean value.

In an embodiment, the second integral value is a sum including addends for each second time interval lying within the first-time interval. The sum may also include at least one addend or two addends for second time intervals (if any) partially overlapping with the first-time interval. The addend for each second time interval includes and preferably is the product of the estimated value of the second variable for the respective second time interval and the difference between the approximated values of the first variable at the second time points limiting the respective second time interval.

In an embodiment, the estimated value of the second variable for the respective second time interval corresponds to the arithmetic mean of the values of the second variable at the second time points limiting the respective second time interval. However, the estimated value may also be determined differently. E.g., the estimated value may be the value of the second variable at one of the second time points limiting the respective second time interval.

In an embodiment, the first frequency is decreased in case that the error falls beyond a predetermined limit being lower than the predetermined threshold. This embodiment leads to a faster simulation speed which may be used in case of low errors.

In an embodiment, the absolute value of the difference between successive approximated values of the first variable is calculated and another warning is output by a user interface in case that the absolute value of the difference between successive approximated values exceeds a predetermined value. This embodiment provides an additional plausibility check giving a hint that the simulation does not work correct due to a high deviation of successive approximated values of the first variable. The user interface used in this embodiment may be the same user interface as the user interface for outputting the warning in case of a high error.

In an embodiment, the first simulation program simulates the kinematics of the technical system whereas the second simulation program simulates a control of the operation of the technical system.

In an embodiment, the first variable is a position value, e.g. in the form of an angular value or a Cartesian position, and the second variable is a force or a torque. In case that the position value is an angular value, the second variable is a torque. In case that the position value is a Cartesian position, the second variable is a force. In this embodiment, the integral values reflect the work done in corresponding first-time intervals.

Embodiments also provide a computer program product with program code, that is stored on a machine-readable carrier, for carrying out the method according to or one or more embodiments thereof when the program code is executed on a computer.

Embodiments also provide a computer program with program code for carrying out the method or one or more embodiments thereof when the program code is executed on a computer.

BRIEF DESCRIPTION OF THE FIGURES

FIG. 2 depicts a flow diagram showing the steps of an embodiment.

DETAILED DESCRIPTION

Figure 1:
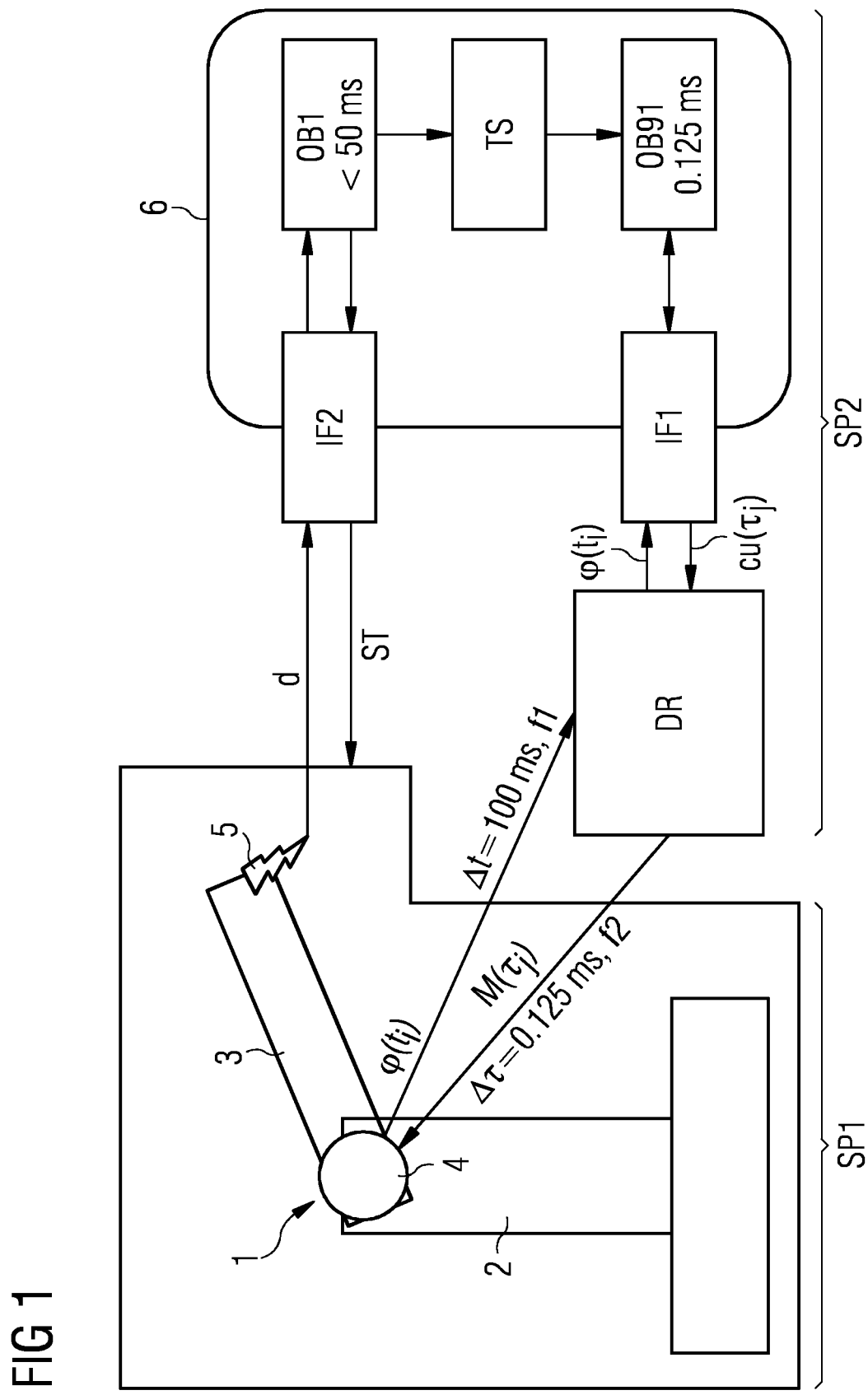
FIG. 1 depicts a schematic drawing showing the interaction of two simulation programs that are to be synchronized based on an embodiment.

The embodiment described in the following refers to two simulation programs designated as SP1 and SP2 in FIG. 1.

It is the purpose of those simulation programs to simulate a technical system in the form of an automatically operating machine 1. For explanation purposes, a very simple construction of a machine is simulated. The construction of machines to be simulated may include a much higher complexity. The machine 1 includes a vertical arm 2 as well as a pivot 4 at which another arm 3 is rotatably attached. At the end of the arm 3 opposite to the pivot 4, an end effector 5 is attached. The machine 1 performs a task in an automation system, e.g. a production system.

The kinematics of the machine 1 is simulated by the first simulation program SP1 that is a rigid body simulator. The simulator may be the Mechatronic Concept Designer or the SimCenter Motion Software developed by Siemens. The program SP1 calculates the angular position $\varphi(t_i)$ of the arm 3 in cycles based on a clock with a frequency f1 corresponding to a time interval $\Delta t$ of 100 ms between successive time points designated as $t_i$. In the following, the term "time" always refers to the virtual simulated time and not to the real time which the simulation programs need for their calculations. The angular positions are output to a drive simulation DR which is part of the second simulation program SP2 and simulates the drive of the machine 1. The drive simulation may be based on the software Amesim or SIMIT developed by Siemens. The drive simulation outputs torque values $M(\tau_j)$. For calculating the angular position $\varphi(t_i)$, only some of the torque values $M(\tau_i)$ output by the drive simulation DR are used by the simulation program SP1.

The torque values $M(\tau_i)$ are output by the drive simulation DR in cycles based on a clock with a higher frequency f2 than frequency f1. The frequency f2 corresponds to time intervals $\Delta T$ of 0.125 ms between successive time points designated as $T_j$. Due to the higher frequency f2, the torque values $M(\tau_i)$ are determined more often than the angular positions $\varphi(t_1)$. The simulation program SP1 only uses the torque values valid at the respective time point $t_i$ repeating with the frequency f1. For example, although the drive simulation DR outputs the torque values $M(\tau_i)$ in a high frequency, the simulation program SP1 will only use the torque values occurring at the time points $t_i$, i.e. the torque values $M(t_i)$.

The angular position $\varphi(t_i)$ is output by the drive simulation DR to an interface IF1 that is an interface of a simulated PLC 6 (PLC=Programmable Logic Controller) used for controlling the machine 1. The PLC 6 includes another interface IF2 receiving a distance d from a distance sensor (not shown) cyclically measuring the distance of the end effector to objects in the neighborhood. The processing of the distance d is done by a process OB1 of the PLC 6. This process is cyclically repeated by a time interval less than 50 ms. The process OB1 calculates a target speed TS of the end effector 5. The speed is processed by another process OB91 of the PLC 6. The process OB1 also determines conflicts (impending collisions) of the end effector with objects in the environment. In case of such conflicts, the process OB1 outputs a stop signal ST transmitted via the interface IF2 to the simulated machine 1 (i.e. the simulation program SP1).

The process OB91 is cyclically repeated by the frequency f2 that corresponds to a time interval of 0.125 ms. Besides the target speed TS, the process OB91 processes the position $\varphi(t_i)$ and outputs via the interface IF1 an electric current $cu(\tau_i)$ determined with the frequency f2. Based on the current that is received by the drive simulation DR, a corresponding torque value $M(\tau_j)$ is calculated and output by the drive simulation.

The drive simulation DR includes a high frequency because it is coupled with the process OB91 running at a high frequency. Due to the different frequencies f1 and f2, both simulation programs SP1 and SP2 are not properly synchronized and may lead to faulty results. This problem cannot be overcome by raising the frequency f1 to the level of the frequency f2. This is because the kinematic calculations performed by the rigid body simulator SP1 cannot be speeded up.

The following problems result from the different scales, i.e. the different frequencies f1 and f2.

Position values for the drive simulation DR must be plausible for each drive cycle. For example, if position values would not change between multiple cycles, the control of the PLC may act disruptive, stopping the drive or increasing the torque to a maximum.

Boundaries for the error that occurs because of the different time scales must be known and kept small to correctly interpret the simulation results.

In order to overcome these problems, an approximation of the position values $\varphi(t_i)$ for time points based on the time interval $\Delta T$ is calculated between successive time points of the interval $\Delta t$, i.e. between successive time points $t_i$ and $t_{i+1}$. This may be achieved by a separate program in the form of an adapter providing outputs of the variable $\varphi$ with the frequency f2, i.e. outputs $\varphi(T_i)$. The outputs are transmitted to the interface IF1 instead of the outputs $\varphi(t_i)$ as shown in FIG. 1. Instead of using an adapter, the approximation may also be done in the drive simulator DR.

Additionally, an error occurring due to the different time scales is determined, e.g. also by using an adapter. The error is based on the work performed by the simulated machine 1, for example by the integral of the torque variable M along the path of the position variable $\varphi$. Due to the different time scales, the work as seen from the simulation program SP1 is different from the work as seen the simulation program SP2. In case that the deviation between the works is too high, a user will be notified as will be described below. The idea of calculating an error based on an integral may also be applied to other tuples than torque and angular position. The idea may be used for tuples describing an effect and a flow. For example, the linear kinematic work represented by the tuple force and position or the electric energy represented by the tuple voltage and current or the enthalpy represented by the tuple pressure and mass flow may be used in order to calculate the error for other types of machines.

In the following, the steps of an embodiment are described with respect to the flow chart of FIG. 2.

The definitions of quantities are provided below.

$\varphi(t_i)$ represents the angular position of the arm 3 at a time t, which is a time according to the frequency f1.

$\Delta t_i = t_{i+1} - t_i$ represents a time interval between the time points $t_{i+1}$ and $t_i$. Due to the constant frequency f1, this time interval is constant and will be referred as to $\Delta t$.

$\omega_{mean}(i) = (\varphi(t_{i+1}) - \varphi(t_i))/\Delta t$ represents the mean angular velocity in the time interval $[t_i, t_{i+1}]$.

$M(t_i)$ represents the torque at the time $t_i$.

$M(\tau_j)$ represents the torque at the time $\tau_j$ that is a time point based on the frequency f2 (i.e. based on the time interval $\Delta \tau$).

The respective steps of the flow chart of FIG. 2 refer to the time interval $[t_i, t_{i+1}]$. The steps are repeated for every new time interval. Step S1 of FIG. 2 processes the position values $\varphi(t_i)$ and $\varphi(t_{i+1})$ of the variable $\varphi$ at the time points $t_i$ and $t_{i+1}$. Based on these values, position values $\varphi(\tau_j)$ between the time points $t_i$ and $t_{i+1}$ are calculated S1 based on the following formula:

$$\varphi(\tau_j) = \varphi(t_i) + \omega_{mean}(i-1) \cdot (\tau_j - t_i)$$

Hence, a linear approximation is used for calculating $\varphi(\tau_j)$. However, another approximation may also be used for calculating $\varphi(\tau_j)$. E.g., a quadratic approximation based on the assumption of a constant acceleration from the last interval $[t_{i-1}, t_i]$ may be used. To do so, the following mean acceleration is calculated:

$$a_{mean}(i) := (\omega_{mean}(i) - \omega_{mean}(i-1))/(t_i - t_{i-1}).$$

By using the mean acceleration, the quadratic approximation is calculated as follows:

$$\varphi(\tau_j) = \varphi(t_i) + \omega_0 \cdot (\tau_j - t_i) + a_{mean}(i) \cdot (\tau_j - t_i)^2/2$$

with $\omega_0 = (\varphi(t_i) - \varphi(t_{i-1}))/(t_i - t_{i-1})$.

Using the approximated values $\varphi(T_j)$, a step S2 performed by the simulation program SP2 determines the torque values $M(\tau_j)$ of the variable M at the respective time points $\tau_j$. Hence, the approximated position values are used for calculating corresponding torque values, thus synchronizing the simulation program SP2 with the simulation program SP1. The torque values $M(\tau_j)$ and also the position values $\varphi(T_j)$ calculated beforehand are used in step S3 in order to calculate a work E1 as seen from the simulation SP1 and a work E2 as seen from the simulation SP2.

The work E1 is calculated as follows:

$$E1 = M(t_i) \cdot (\varphi(t_{i+1}) - \varphi(t_i)).$$

This work is an approximation for the work done within a time interval $[t_i, t_{i+1}]$, only taking into account torque values and position values based on the frequency f1.

The work E2 as seen from the simulation program SP2 is calculated for multiple time intervals $[\tau_i, \tau_{i+1}]$ of the length $\Delta t$. All time intervals (completely and partially) overlapping with the respective time interval $[t_i, t_{i+1}]$ are taken into account. For each time interval $[\tau_j, \tau_{j+i}]$, a mean value of the torque is calculated as follows:

$$\text{mean\_}M(j) = (M(\tau_j) + M(\tau_{j+i}))/2.$$

The work for the respective time interval $[\tau_j, \tau_{j+1}]$ is estimated by the following formula:

$$E2j = \text{mean\_}M(j) \cdot (\varphi(\tau_{j+i}) - \varphi(\tau_j)).$$

Taking into account the works E2j for all intervals $[\tau_j, \tau_{j+1}]$ overlapping with the interval $[t_i, t_{i+1}]$, the total work E2 is calculated by the following formula:

$$E2 = \Sigma_j E2j = \Sigma_j \text{mean\_}M(j) \cdot (\varphi(\tau_{j+1}) - \varphi(\tau_j)).$$

Based on the above works E2 and E1, the following error ERR is determined in step S4 of FIG. 2:

$$ERR = M(t_i) \cdot (\varphi(t_{i+1}) - \varphi(t_i)) - \Sigma_j \text{mean\_}M(j) \cdot (\varphi(t_{j+1}) - \varphi(t_j)).$$

In step S5 of FIG. 2, this error ERR is compared with a threshold value TH. In case that the error ERR exceeds the threshold value TH, a warning WA is output by user interface UI (e.g. by a display) in order to inform the user that there are inconsistencies in the interaction of the simulation programs SP1 and SP2. Additionally, the error may also be output continuously during the course of the simulation in order to inform the user about the development of the error. Furthermore, the method may automatically initiate counter measures in order to decrease the error. For example, in case that the error exceeds the threshold value TH, the frequency f1 may be increased, i.e. the time interval $\Delta t$ may be decreased. This results in a higher precision of the slower simulation SP1 and may decrease the error ERR.

In an embodiment, an additional limit lower than the threshold limit TH is processed in step S5. In case that the error ERR is below the additional limit, the frequency f1 is decreased resulting in an increase of the speed of the simulation program SP1.

In an embodiment, the difference between successive approximated values of the variable φ is continuously monitored. The difference is compared with another limit given by the product of the time interval ΔT and a maximum angular velocity change $\omega_{max}$ that is the biggest plausible angular velocity change. The difference is verified during the simulation to determine whether the following equation is true:

$$|\varphi(t_{j+1})-\varphi(t_j)|\leq \Delta T\cdot\omega_{max}.$$

In case that this equation is not fulfilled, another warning is output by the user interface UI informing the user that parameters of the simulation are not plausible so that the simulation may lead to incorrect results.

The embodiments described herein include multiple advantages. Simulations including different time scales may be synchronized by approximating values of the slower simulation for use in the faster simulation. Moreover, the error between multi-scale simulations may be calculated and presented to the user. Embodiments may be implemented outside the simulation tools, e.g. in a co-simulation framework. Summarized, the embodiments provide a new efficient simulator coupling in a standardized way that adapts to multiple scales. Embodiments provide for coupling simulation models of different vendors without the need of using one common time scale.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for synchronizing programs for simulation of a technical system, the programs comprising a first simulation program and a second simulation program, wherein the first simulation program simulates kinematics of the technical system and the second simulation program simulates a control of an operation of the technical system, wherein the first simulation program outputs values of a first variable at first time points between first time intervals according to a first frequency in virtual simulated time and the second simulation program outputs values of a second variable at second time points between second time intervals according to a second frequency in virtual simulated time, the first frequency being lower than the second frequency, wherein the values of the first variable are processed by the second simulation program in order to determine the values of the second variable and where the values of the second variable at the first time points are processed by the first simulation program in order to determine values of the first variable the method comprising:

determining values of the first variable at second time points between two successive first time points based on an approximation, wherein the second simulation program uses the approximated values in order to determine values of the second variable at second time points between the two successive first time points;

approximating for respective first time intervals an integral of the second variable along a path of the first variable within the respective first time interval based on a first integral value and a second integral value, wherein the first integral value is determined based on the values of the first variable at first time points limiting the respective first time interval and an estimated value of the second variable for the respective first time interval and the second integral value is determined based on the approximated values of the first variable at second time points limiting respective second time intervals lying within the respective first time interval and an estimated value of the second variable for each second time interval lying with the respective first time interval, wherein the first integral value and the second integral value reflect physical coupling between the first simulation program and the second simulation program;

determining an error based on an absolute value of a difference between the first integral value and the second integral value; and informing a user automatically when there are inconsistencies in the interaction of the first and second simulation programs which may lead to incorrect results by outputting a warning through a user interface, increasing the first frequency, or outputting the warning and increasing the first frequency when the error exceeds a predetermined threshold.

2. The method according to claim 1, wherein the first integral value comprises a product of the estimated value of the second variable for the respective first time interval and difference between the values of the first variable at the first time points limiting the respective first time interval.

3. The method of claim 1, wherein the estimated value of the second variable for the respective first time interval corresponds to the value of the second variable valid at the first time point at which the respective first time interval starts.

4. The method of claim 1, wherein the second integral value is a sum comprising addends for each second time interval lying within the first time interval, where the addend for each second time interval comprises a product of the estimated value of the second variable for the respective second time interval and a difference between the approximated values of the first variable at the second time points limiting the respective second time interval.

5. The method of claim 1, wherein the estimated value of the second variable for the respective second time interval corresponds to an arithmetic mean of the values of the second variable at the second time points limiting the respective second time interval.

6. The method of claim 1, wherein the first frequency is decreased in case that the error falls beyond a predetermined limit being lower than the predetermined threshold.

7. The method of claim 1, wherein the absolute value of a difference between successive approximated values of the first variable is calculated and another warning is output by a user interface in case that the absolute value of the difference between successive approximated values exceeds a predetermined value.

8. The method of claim 1, wherein the technical system is an automation system or at least one automatically operating machine of an automation system.

9. The method of claim 1, wherein the first variable is a position value and the second variable is a force or a torque.

10. The method of claim 1, wherein the physical coupling comprises at least one of a physical work, electric energy, or enthalpy associated with the technical system.

11. A non-transitory computer-readable data storage medium that stores machine-readable instructions executable by at least one processor for synchronizing programs for simulation of a technical system, the programs comprising a first simulation program and a second simulation program, wherein the first simulation program simulates kinematics of the technical system and the second simulation program simulates a control of an operation of the technical system, wherein the first simulation program outputs values of a first variable at first time points between first time intervals according to a first frequency in virtual simulated time and the second simulation program outputs values of a second variable at second time points between second time intervals according to a second frequency in virtual simulated time, the first frequency being lower than the second frequency, wherein the values of the first variable are processed by the second simulation program in order to determine the values of the second variable and where the values of the second variable at the first time points are processed by the first simulation program in order to determine values of the first variable, the machine-readable instructions comprising:

determining values of the first variable at second time points between two successive first time points based on an approximation, wherein the second simulation program uses the approximated values in order to determine values of the second variable at second time points between the two successive first time points;

approximating for respective first time intervals an integral of the second variable along a path of the first variable within the respective first time interval based on a first integral value and a second integral value, wherein the first integral value is determined based on the values of the first variable at first time points limiting the respective first time interval and an estimated value of the second variable for the respective first time interval and the second integral value is determined based on the approximated values of the first variable at second time points limiting respective second time intervals lying within the respective first time interval and an estimated value of the second variable for each second time interval lying with the respective first time interval, wherein the first integral value and the second integral value reflect physical coupling between the first simulation program and the second simulation program;

determining an error based on an absolute value of a difference between the first integral value and the second integral value; and informing a user automatically when there are inconsistencies in the interaction of the first and second simulation programs which may lead to incorrect results by outputting a warning through a user interface, increasing the first frequency, or outputting a warning and increasing the first frequency when the error exceeds a predetermined threshold.

12. The non-transitory computer-readable data storage medium of claim 11, wherein the first integral value comprises a product of the estimated value of the second variable for the respective first time interval and a difference between the values of the first variable at the first time points limiting the respective first time interval.

13. The non-transitory computer-readable data storage medium of claim 11, wherein the estimated value of the second variable for the respective first time interval corresponds to the value of the second variable valid at the first time point at which the respective first time interval starts.

14. The non-transitory computer-readable data storage medium of claim 11, wherein the second integral value is a sum comprising addends for each second time interval lying within the first time interval, where the addend for each second time interval comprises a product of the estimated value of the second variable for the respective second time interval and a difference between the approximated values of the first variable at the second time points limiting the respective second time interval.

15. The non-transitory computer-readable data storage medium of claim 11, wherein the estimated value of the second variable for the respective second time interval corresponds to an arithmetic mean of the values of the second variable at the second time points limiting the respective second time interval.

16. The non-transitory computer-readable data storage medium of claim 11, wherein the first frequency is decreased in case that the error falls beyond a predetermined limit being lower than the predetermined threshold.

17. The non-transitory computer-readable data storage medium of claim 11, wherein the absolute value of a difference between successive approximated values of the first variable is calculated and another warning is output by a user interface in case that the absolute value of the difference between successive approximated values exceeds a predetermined value.

18. The non-transitory computer-readable data storage medium of claim 11, wherein the technical system is an automation system or at least one automatically operating machine of an automation system.

19. The non-transitory computer-readable data storage medium of claim 11, wherein the first variable is a position value and the second variable is a force or a torque.

20. The non-transitory computer-readable data storage medium of claim 11, wherein the physical coupling comprises at least one of a physical work, electric energy, or enthalpy associated with the technical system.

* * * * *